United States Patent [19]
Ono

[11] Patent Number: 5,154,729
[45] Date of Patent: Oct. 13, 1992

[54] SEMICONDUCTOR MANUFACTURING APPARATUS

[75] Inventor: Reiji Ono, Yokohama, Japan

[73] Assignee: Kabushiki Kaisha Toshiba, Kawasaki, Japan

[21] Appl. No.: 702,400

[22] Filed: May 20, 1991

[30] Foreign Application Priority Data

May 21, 1990 [JP] Japan ................... 2-129106

[51] Int. Cl.⁵ .......................... H01L 21/00
[52] U.S. Cl. .................. 29/25.01; 437/209; 228/49.1; 228/443
[58] Field of Search .............. 29/25.01, 25.02, 25.03; 228/49.1, 49.7, 49.2, 212, 179, 180.1, 180.2, 110, 205, 44.3; 437/209, 924

[56] References Cited

U.S. PATENT DOCUMENTS

| | | |
|---|---|---|
| 4,125,252 | 11/1978 | Louanny ................... 29/25.01 |
| 4,127,432 | 11/1978 | Kuwano et al. ........... 29/25.01 |
| 5,020,200 | 6/1991 | Mimasaka et al. ........ 29/25.01 |

FOREIGN PATENT DOCUMENTS 60-8146  3/1985  Japan ...................... 228/44.3

Primary Examiner—Brian E. Hearn
Assistant Examiner—Kevin M. Picardat
Attorney, Agent, or Firm—Oblon, Spivak, McClelland, Maier & Neustadt

[57] ABSTRACT

The upper surface of a stage has first, second and third surfaces formed in a stepped configuration, the first and second surfaces are connected to each other by a first side surface and the second and third surfaces are connected to each other by a second side surface. A circular arc-form concave portion is formed in the side surface and a chip carrier is disposed on the second surface inside the concave portion. A depressing plate is disposed on the second surface so as to freely slide in a direction perpendicular to the first side surface. The depressing plate is fixed on a clamp member which is connected to a rotor rotatably mounted on the stage. The rotor is biased by means of a spring so as to move the depressing plate towards the concave portion. The depressing plate has a depressing portion which is set in parallel with the first side surface and the position of the chip carrier is determined by the depressing portion of the depressing plate and the internal surface of the concave portion.

7 Claims, 3 Drawing Sheets

SEMICONDUCTOR MANUFACTURING APPARATUS

BACKGROUND OF THE INVENTION

1. Field of the Invention

This invention relates to a semiconductor manufacturing apparatus for mounting an optical semiconductor element on a chip carrier, for example, and more particularly to a semiconductor manufacturing apparatus capable of mounting various types of chip carriers precisely in a preset position on a stage at any time.

2. Description of the Related Art

In general, different types of optical semiconductor elements are sometimes incorporated into an optical communication module. The optical semiconductor elements are separately mounted on chip carriers formed of ceramics, for example, to simplify the incorporation into and the maintenance of the optical communication module.

FIGS. 5 and 6 show conventional semiconductor manufacturing apparatuses. The optical semiconductor element is mounted on the chip carrier by use of the above manufacturing apparatus.

In the conventional semiconductor manufacturing apparatus shown in FIG. 5, a circular stage 1 is formed of metal and can be heated. The surface of the stage 1 has first, second and third surfaces 2, 3 and 4 and stepped portions are formed between the first and second surfaces 2 and 3 and between the second and third surfaces 3 and 4. A rectangular concave portion 6 for positioning a chip carrier 5 is formed in the central portion of the stepped portion between the first and second surfaces 2 and 3. The carrier chip 5 is mounted in the concave portion 6 on the second surface 3. The chip carrier 5 is depressed against the side surface of the concave portion 6 by a depressing plate 7 which is movably disposed on the second surface 3 and fixed in the position. That is, a holding plate 8 disposed on the depressing plate 7 has both ends in the lengthwise direction thereof fixed on the second surface 3 by means of screws 9a and a gap in which the depressing plate 7 can be moved is provided between the holding plate 8 and the second surface 3. The depressing plate 7 is fixed on a clamp portion 10 by means of screws 9b and the clamp portion 10 is disposed to freely move on the third surface 4.

With the above semiconductor manufacturing apparatus, since a chip carrier is disposed inside the rectangular concave portion 6, a chip carrier which is larger than the concave portion 6 cannot be dealt with. If the size of the concave portion 6 is increased, the position of the chip carrier in the concave portion 6 cannot be precisely determined, lowering the positioning precision of an optical semiconductor element to be mounted on the chip carrier.

Further, with the conventional semiconductor manufacturing apparatus shown in FIG. 6, the chip carrier 5 is mounted on the circular plate-like metal stage 11 which can be heated, a semi-circular depressing plate 12 is mounted on one end portion of the chip carrier 5, and the chip carrier 5 is depressed against the stage 11 by means of the depressing plate 12 and fixed there.

A chip carrier is extremely small and is generally several mm square. Therefore, as shown in FIG. 6, when one end portion of the chip carrier 5 is depressed by the depressing plate 12, the other end portion of the chip carrier is lifted from the stage 11 and the chip carrier cannot be fixedly positioned. Further, when the chip carrier 5 is depressed by means of the depressing plate 12, a metal film such as an electrode which covers the surface of the chip carrier 5 may be sometimes damaged.

SUMMARY OF THE INVENTION

An object of this invention is to provide a semiconductor manufacturing apparatus which can hold a chip carrier precisely in a preset position so that an optical semiconductor element can be accurately mounted on the chip carrier and at the same time which can precisely hold various types of chip carriers without damaging the chip carrier.

The above object can be attained by the following structure.

A semiconductor manufacturing apparatus comprises:

a stage having a first surface, a second surface provided in a level lower than the first surface and a side surface connecting the first and second surfaces to each other, a chip carrier on which a semiconductor element is to be disposed being mounted on the second surface;

a depressing plate disposed to freely move in a direction perpendicular to the side surface on the second surface, for depressing the chip carrier towards the side surface; and a concave portion formed in a circular arc form and disposed on one of the side surface and the depressing plate, for receiving the chip carrier.

According to this invention, the concave portion of circular arc form is formed in the side surface connecting the first and second surfaces to each other or the depressing surface of the depressing plate. The chip carrier mounted on the second surface is held between the circular arc-form concave portion formed in the side surface and the depressing surface of the depressing plate or between the side surface and the circular arc-form concave portion formed in the depressing surface of the depressing plate. Therefore, if the side surface and the depressing surface of the depressing plate are set in parallel to each other, the chip carrier receives force acting towards the center of the circular arc-form concave portion to move along the circular arc-form concave portion and is always fixed in a preset position on the second surface irrespective of the position in which the chip carrier is placed before being fixed. As a result, an optical semiconductor element can be precisely mounted on the chip carrier.

Further, since the circular arc-form concave portion and the side surface or the depressing surface of the depressing plate are not set in contact with the surface of the chip carrier, a metal film such as an electrode formed on the surface of the chip carrier will not be damaged.

If the length of one side of the chip carrier is less than the maximum value of the arc of the circular arc-form concave portion, the chip carrier can be stably fixed irrespective of the shape thereof.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

There will now be described an embodiment of this invention with reference to the accompanying drawings.

Figure 1:
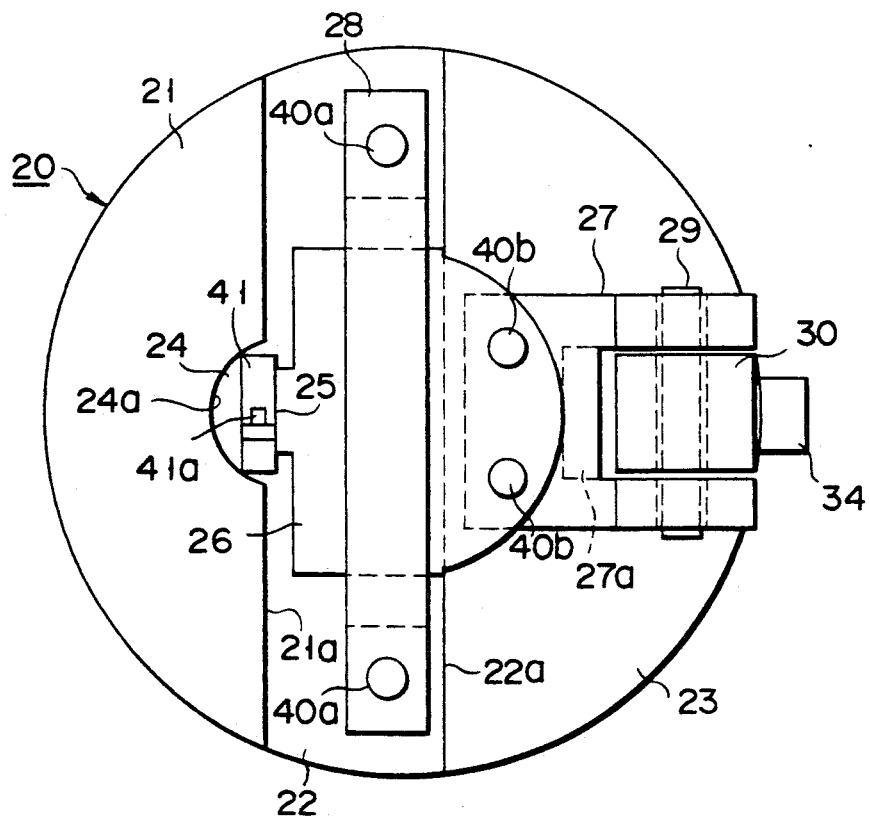
FIG. 1 is a top plan view showing one embodiment of a semiconductor manufacturing apparatus of this invention.
Figure 2:
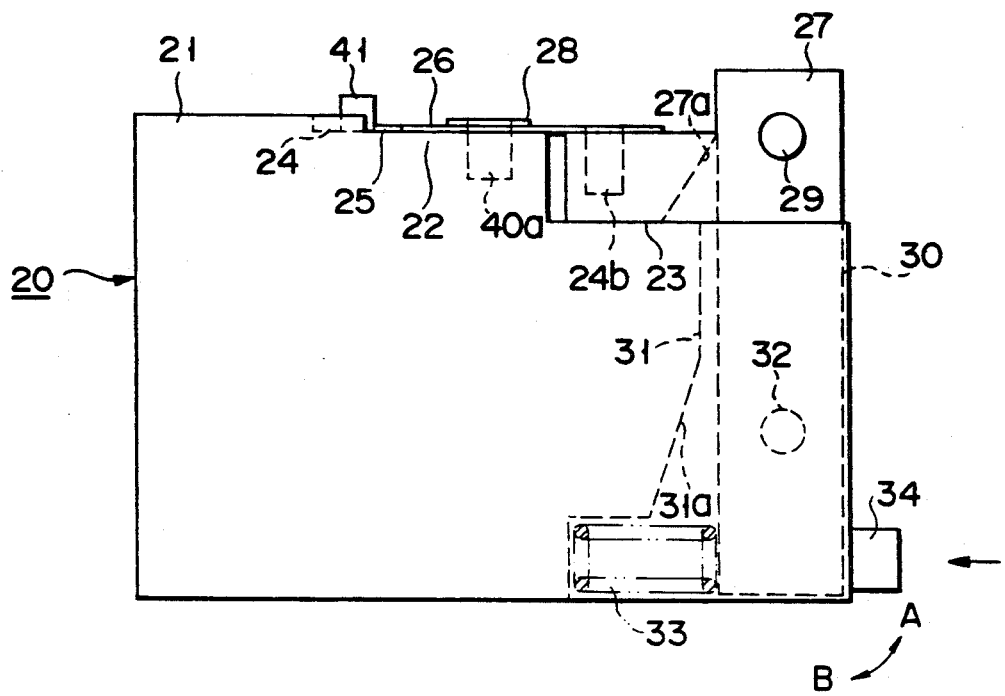
FIG. 2 is a side view of the semiconductor manufacturing apparatus shown in FIG. 1.

FIGS. 1 and 2 show one embodiment of a semiconductor manufacturing apparatus of this invention.

In the semiconductor manufacturing apparatus shown in FIGS. 1 and 2, a circular stage 20 is formed of metal and can be heated. The surface of the stage 20 has first, second and third surfaces 21, 22 and 23 formed in a stepped configuration. A first side surface 21a is formed between the first and second surfaces 21 and 22 and a second side surface 22a is formed between the second and third surfaces 22 and 23. Thus, the second surface 22 is lower than the first surface 21 and the third surface 23 is lower than the second surface 22. A circular arc-form concave portion 24 for positioning a chip carrier 41 is formed in the central portion of the first side surface 21a. The circular arc-form concave portion 24 has a side surface 24a formed in a circular arc form and the second surface 22 is exposed through the concave portion 24. The chip carrier 41 is disposed on the second surface 22 inside the concave portion 24. A plurality of electrodes (not shown) which are electrically insulated are formed by plating on the surface of the chip carrier 41.

A depressing plate 26 for fixing the chip carrier is disposed on the second surface 22. The depressing plate 26 is disposed so as to freely slide in a direction perpendicular to the first side surface 21a on the second surface 22. That is, a holding plate 28 is fixed on the second surface 22 by means of screws 40a. A gap in which the depressing plate 26 can slide is formed between the holding plate 28 and the second surface 22, and the depressing plate 26 is set inside the gap. A depressing portion 25 for depressing the chip carrier against the circular arc form side surface 24a is disposed on that portion of the depressing plate 26 which faces the circular arc form side surface 24a of the concave portion 24. The surface of the depressing portion 25 which is set in contact with the chip carrier is set in parallel with the first side surface 21a.

The depressing plate 26 is connected to one end of a clamp member 27 by means of screws 40b. The clamp member 27 is disposed to freely slide on the third surface. The other end of the clamp member 27 is connected to one end of a rotor 30 via a shaft 29. As shown in FIG. 2, the rotor 30 is disposed in a groove 31 formed in the stage 20. The groove 31 has an inclined portion 31a formed at the lower portion thereof and the intermediate portion of the rotor 30 is supported on the stage 20 by a shaft 32. Thus, the rotor 30 may freely rotate around the shaft 32 in the groove 31. The clamp member 27 has an inclined portion 27a formed at the intermediate portion thereof and is disposed to move on the third surface 23 with rotation of the rotor 30.

A spring 33 is disposed between the other end of the rotor 30 and the internal surface of the groove 31 and the rotor 30 is always biased in a direction indicated by an arrow A in the drawing. Further, a button 34 which is depressed to push the rotor 30 against the biasing force of the spring 33 is disposed on the other end of the rotor 30.

Now, the operation of mounting a light receiving element 41a serving as an optical semiconductor element on the chip carrier 41 by use of the semiconductor manufacturing apparatus of the above construction.

Figure 3:
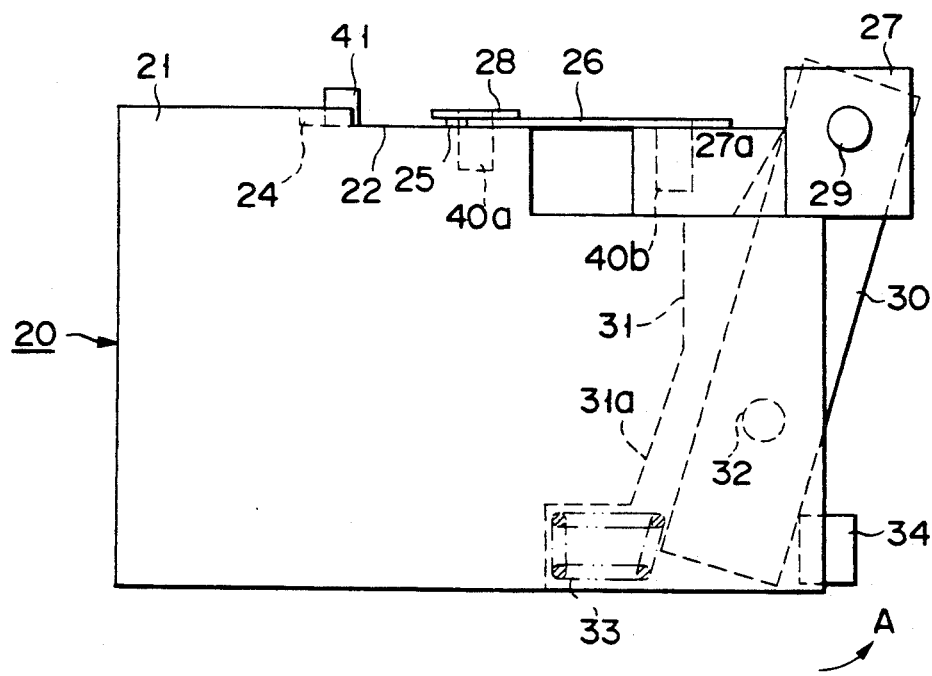
FIG. 3 is a side view for illustrating the operation of the semiconductor manufacturing apparatus shown in FIG. 2.

First, when the button 34 which is disposed on the rotor 30 is depressed against the biasing force of the spring 33, the rotor 30 is rotated in a direction indicated by an arrow B in the drawing. At this time, as shown in FIG. 3, the clamp member 27 and depressing plate 26 are moved in a direction away from the circular arc-form concave portion 24. In this condition, the chip carrier 41 is disposed on the second surface 22 inside the concave portion 24. After this, if the depressing force on the button 34 is released, the rotor 30 is rotated in a direction indicated by the arrow A by the biasing force of the spring 33. As a result, the depressing plate 26 is moved towards the deepest portion of the concave portion 24 and the side surface of the chip carrier 41 is depressed against the depressing surface 25 of the depressing plate 26. The opposite side surface (corner portion) of the chip carrier slides on the circular arc-form side surface 24a of the concave portion 24 and is stopped when the side surface of the chip carrier 41 becomes parallel to the depressing surface 25. In this condition, the chip carrier 41 is fixed in position by means of the circular arc-form side surface 24a and the depressing surface 25 of the depressing plate 26.

Next, the light receiving element 41a is bonded by soldering to a preset portion of the electrode (not shown) on the chip carrier 41. After this, the electrode terminal of the light receiving element 41a is connected to another electrode (not shown) on the chip carrier 41 via a metal wire (not shown).

Finally, when the button 34 of the rotor 30 is depressed, the depressing plate 26 is separated from the concave portion 24 and the chip carrier 41 is set free from the fixed position. In this condition, the chip carrier 41 on which the light receiving element 41a is mounted can be taken out from the concave portion 24.

Therefore, the chip carrier 41 of the same shape can be fixed in the preset position on the second surface 22. In this embodiment, the fixed position of the chip carrier 41 is set to a position in which the side surface of the chip carrier 41 is set in parallel with the depressing portion 25 of the depressing plate 26 and set in contact with the circular arc-form side surface 24a.

According to the semiconductor manufacturing apparatus of the above construction, the chip carrier is fixed in the preset position on the stage 20 by means of the circular arc-form concave portion 24 and the depressing portion 25 of the depressing plate 26. Therefore, the chip carrier 41 of the same shape can be always fixed in the same position on the second surface 22. Further, if the chip carrier is smaller than the maximum arc length of the concave portion 24, various types of chip carriers can be fixed with the same precision.

In the above embodiment, since variation in the fixed position of the chip carrier could be reduced, the yield associated with the precision of the positional relation between the optical semiconductor element and the chip carrier was higher than 95 % and the yield could be improved by more than 35 %.

Further, with the above semiconductor manufacturing apparatus, the chip carrier was fixed by depressing the side surface and the corner portion thereof and the upper surface of the chip carrier was not depressed. Therefore, the yield determined by externally viewing the damage on the surface of the chip carrier was higher than 98 % and the yield was improved by more than 30 %.

Figure 4:
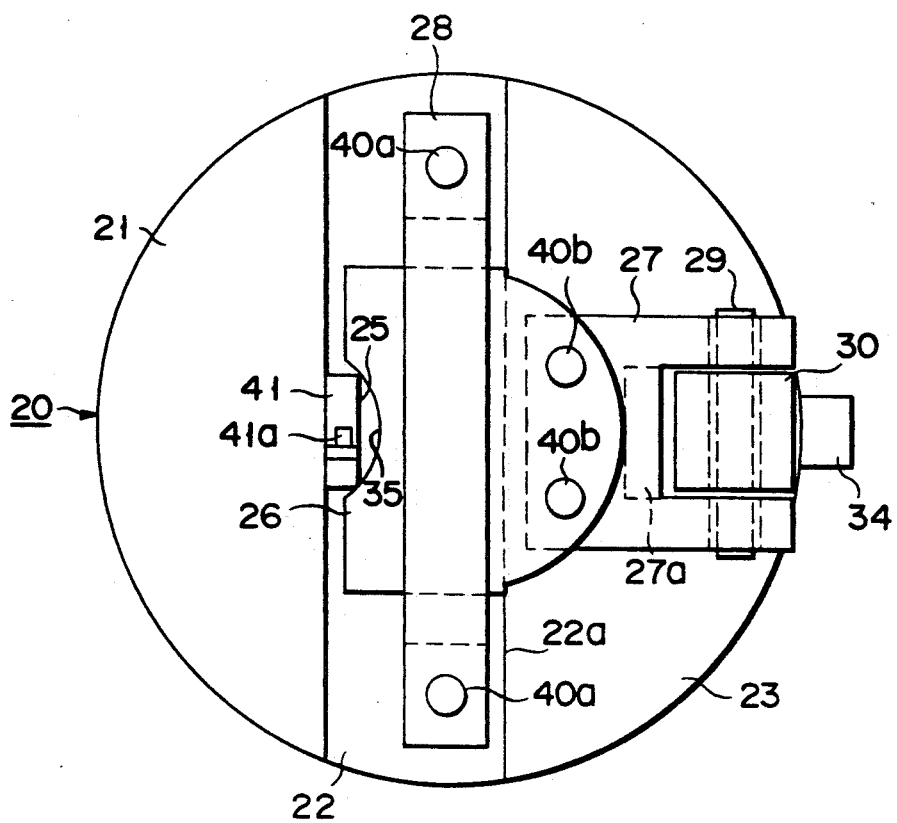
FIG. 4 is a top plan view showing another embodiment of a semiconductor manufacturing apparatus of this invention.
Figure 5:
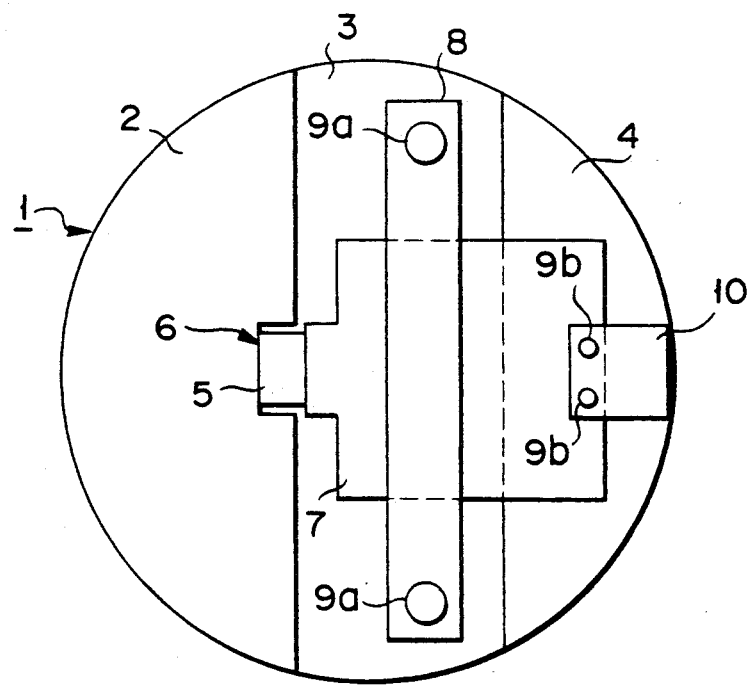
FIGS. 5 and 6 are top plan views showing conventional semiconductor manufacturing devices.
Figure 6:
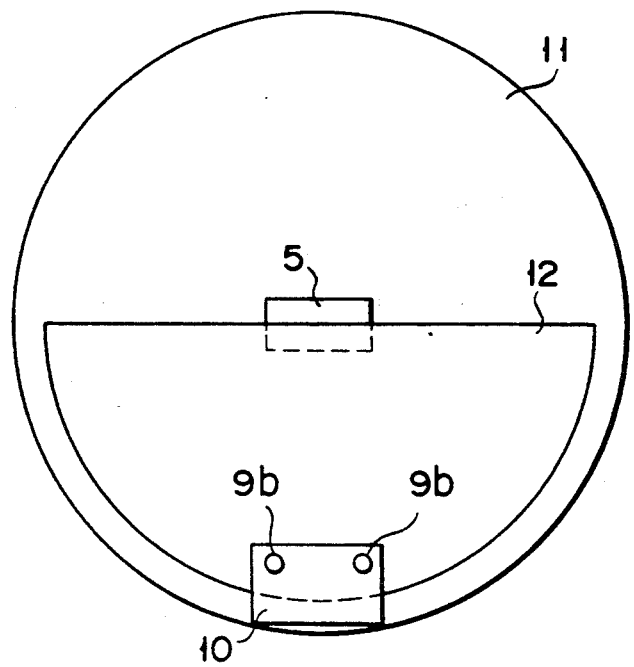

FIG. 4 shows a second embodiment of this invention and portions which are the same as those of FIGS. 1 and 2 are denoted by the same reference numerals.

In the above embodiment, the circular arc-form concave portion 24 is formed in the first side surface 21a, but the position in which the circular arc-form concave portion is formed is not limited to the position in the first side surface 21a.

FIG. 4 shows a case wherein a circular arc-form concave portion is formed in the depressing portion 25 of the depressing plate 26. In this case, a circular arc-form concave portion 35 is formed instead of the depressing portion 25 of the depressing plate 26 and the first side surface 21a is made flat.

The chip carrier 41 is disposed on the second surface 22 and fixed with both ends thereof held between the first side surface 21a and the circular arc-form concave portion 35 of the depressing plate 26. In this embodiment, the same effect as that of the former embodiment can be attained.

In the above embodiment, the chip carrier on which a light receiving element is mounted as an optical semiconductor element is explained, but this invention is not limited to this and this invention can also be applied to a chip carrier on which another type of optical semiconductor element such as a light emitting element is mounted.

Further, this invention is not limited to the optical semiconductor element but can be applied to another semiconductor element manufacturing apparatus.

In the above embodiments, the chip carrier is formed in a rectangular form, but it is not limited to this shape and the same effect can be obtained when a chip carrier of trapezoidal form or cylindrical form is used.

Further, in the above embodiments, the optical semiconductor element is fixed on the chip carrier by heating the stage, but it is not limited to this and it is possible to blow hot air to the chip carrier, for example.

In the above embodiments, the depressing plate 26 is moved by means of the clamp member 27 and rotor 30, but this invention is not limited to this. Further, the clamp member 27 and rotor 30 may be driven by use of a driving source.

In addition, this invention can be variously modified without departing from the technical scope thereof.

What is claimed is:

1. A semiconductor manufacturing apparatus comprising:
   a stage having a first surface, a second surface provided in a level lower than said first surface and a side surface connecting said first and second surfaces to each other, a chip carrier on which a semiconductor element is to be disposed being mounted on said second surface;
   a depressing plate disposed to freely move in a direction perpendicular to said side surface on said second surface, for depressing said chip carrier towards said side surface; and
   a concave portion formed in a circular arc form on one of said side surface and said depressing plate, for receiving said chip carrier.

2. An apparatus according to claim 1, further comprising:
   a clamp member having one end disposed on said depressing plate to freely move on said second surface;
   a rotor rotatably mounted on the other end of said clamp member, the intermediate portion of said rotor being rotatably supported on said stage; and
   an elastic member disposed between the other end of said rotor and said stage, for biasing said rotor in a preset direction said clamp member and depressing plate being biased towards said side surface by means of said rotor.

3. A semiconductor manufacturing apparatus comprising:
   a stage having a first surface, a second surface provided in a level lower than said first surface and a side surface connecting said first and second surfaces to each other, a chip carrier on which a semiconductor element is to be disposed being mounted on said second surface;
   a depressing plate disposed to freely move in a direction perpendicular to said side surface on said second surface, for depressing said chip carrier towards said side surface; and
   a concave portion formed in a circular arc form on that portion of said side surface which faces said depressing plate, for receiving said chip carrier.

4. An apparatus according to claim 3, wherein said depressing plate has a depressing portion which is set in parallel to said side surface and in contact with said chip carrier.

5. An apparatus according to claim 3, further comprising:
   a clamp member having one end disposed on said depressing plate to freely move on said second surface;
   a rotor rotatably mounted on the other end of said clamp member, the intermediate portion of said rotor being rotatably supported on said stage; and
   an elastic member disposed between the other end of said rotor and said stage, for biasing said rotor in a preset direction, said clamp member and depressing plate being biased towards said side surface by means of said rotor.

6. A semiconductor manufacturing apparatus comprising:
   a stage having a first surface, a second surface provided in a level lower than said first surface and a side surface connecting said first and second surfaces to each other, a chip carrier on which a semiconductor element is to be disposed being mounted on said second surface;
   a depressing plate disposed to freely move in a direction perpendicular to said side surface on said second surface, for depressing said chip carrier towards said side surface; and
   a concave portion formed in a circular arc form on that portion of said depressing plate which faces said side surface, for receiving said chip carrier.

7. An apparatus according to claim 6, further comprising:

a clamp member having one end disposed on said depressing plate to freely move on said second surface;

a rotor rotatably mounted on the other end of said clamp member, the intermediate portion of said rotor being rotatably supported on said stage; and an elastic member disposed between the other end of said rotor and said stage, for biasing said rotor in a preset direction, said clamp member and depressing plate being biased towards said side surface by means of said rotor.

* * * * *